(12) United States Patent
Chang

(10) Patent No.: US 8,039,851 B2
(45) Date of Patent: Oct. 18, 2011

(54) THREE-DIMENSIONAL LED LIGHT-EMITTING PLATE

(75) Inventor: Rong-Ming Chang, Taipei County (TW)

(73) Assignee: Chia-Cheng Chang, Taipei County (TW)

( * ) Notice: Subject to any disclaimer, the term of this patent is extended or adjusted under 35 U.S.C. 154(b) by 193 days.

(21) Appl. No.: 12/615,081

(22) Filed: Nov. 9, 2009

(65) Prior Publication Data

US 2010/0123143 A1    May 20, 2010

(30) Foreign Application Priority Data

Nov. 20, 2008    (CN) ...................... 2008 2 0167673 U

(51) Int. Cl.
*H01L 29/18* (2006.01)

(52) U.S. Cl. .................... 257/88; 257/E33.058; 257/91; 257/98

(58) Field of Classification Search .................... 257/88, 257/91, 98, 708–710
See application file for complete search history.

(56) References Cited

U.S. PATENT DOCUMENTS

2010/0252843 A1* 10/2010 Ohashi et al. ................... 257/91

\* cited by examiner

Primary Examiner — Marcos D. Pizarro
Assistant Examiner — Eva Yan Montalvo
(74) Attorney, Agent, or Firm — Muncy, Geissler, Olds & Lowe, PLLC

(57) ABSTRACT

In the field of opto-electronic technology, a three-dimensional (3D) light-emitting diode (LED) light-emitting plate is described. The 3D LED light-emitting plate includes an aluminum substrate. The aluminum substrate is vertically disposed. Notches are formed on an upper side of the aluminum substrate in a thickness direction. LED chips are mounted in the notches. A flexible circuit layer is disposed on a surface of the aluminum substrate. Each LED chip is connected to a circuit of the flexible circuit layer by a gold wire. A fluorescent colloid light-emitting shell is disposed outside each LED chip correspondingly. A cavity is formed between the LED chip and the fluorescent colloid light-emitting shell. A lower portion of the fluorescent colloid light-emitting shell is fixed on the aluminum substrate. The 3D LED light-emitting plate effectively improves the luminous brightness and efficiency of an LED and enlarges an effective light-emitting angle, and alleviates the problem of non-uniform light pattern and light color, such that an LED white light lamp can achieve the luminous effect of a tungsten lamp. The fluorescent colloid light-emitting shell wraps the LED chip, which not only protects the LED chip from dust and produces white light, but is also suitable for use in a severe environment. Moreover, the production cost is reduced due to the simple structure.

8 Claims, 2 Drawing Sheets

THREE-DIMENSIONAL LED LIGHT-EMITTING PLATE

BACKGROUND OF THE INVENTION

1. Field of Invention

The present invention relates to the field of opto-electronic technology, and more particularly to a three-dimensional (3D) light-emitting diode (LED) light-emitting plate.

2. Related Art

Two methods for fixing a high-power LED chip exist in the prior art. In one method, a high-power chip is firstly fixed on a copper support and then powered on to emit light by gold wire bonding, and heat is dissipated through the support. In the other method, a chip is fixed on a surface of an aluminum substrate and then powered on to emit light by gold wire bonding, and a heat dissipation effect is achieved through the aluminum substrate. In both the two structures, the LED is surface-mounted on a plane and then soldered. For the production process in which the LED chip is mounted on the substrate surface, the LED only has an effective light-emitting angle of 65 degrees, and cannot illuminate a large area. In addition, a halo effect occurs, resulting in a color difference between light in the center and edges of a light pattern formed by the LED. Moreover, in the existing product, a fluorescent powder colloid covers a surface of the LED chip and a gold wire, and the gold wire is often broken by the colloid due to thermal expansion and contraction of the colloid and becomes a blind spot. Since the working temperature of the colloid can only be maintained at 80° C. to −10° C., and thermal expansion and contraction of the colloid influences the quality of the chip, the chip is not suitable for use in a severe working environment. The excessively small space causes refraction of the light emitted by the chip inside the colloid, which reduces the luminous performance. The production cost of the existing product is high.

SUMMARY OF THE INVENTION

In view of the above problems in the prior art, the present invention is directed to a 3D LED light-emitting plate, which effectively improves the luminous brightness and efficiency of an LED and enlarges an effective light-emitting angle, and alleviates the problem of non-uniform light pattern and light color, such that an LED white light lamp can achieve the luminous effect of a tungsten lamp.

The 3D LED light-emitting plate includes an aluminum substrate. The aluminum substrate is vertically disposed. Notches are formed on an upper side of the aluminum substrate in a thickness direction. LED chips are mounted in the notches. A flexible circuit layer is disposed on a surface of the aluminum substrate. Each LED chip is connected to a circuit of the flexible circuit layer by a gold wire. A fluorescent colloid light-emitting shell is disposed outside each LED chip correspondingly. A cavity is formed between the LED chip and the fluorescent colloid light-emitting shell. A lower portion of the fluorescent colloid light-emitting shell is fixed on the aluminum substrate.

In the 3D LED light-emitting plate, front and rear sides of the LED chip mounted in each notch are in the same plane as front and back sides of the aluminum substrate.

In the 3D LED light-emitting plate, a connecting bayonet is disposed at a bottom of the aluminum substrate.

In the 3D LED light-emitting plate, the fluorescent colloid light-emitting shell is a spherical structure having an opening disposed on a lower portion thereof, and a side of the fluorescent colloid light-emitting shell having the opening is fitted on the aluminum substrate and fixed by a pin.

In the 3D LED light-emitting plate, the LED chips mounted in the notches are connected in series, and a power of the LED chip is 1 w.

In the 3D LED light-emitting plate, a light-emitting angle of the LED chip mounted in each notch is 259 degrees.

In the 3D LED light-emitting plate, the LED chip is adhesively connected to a bottom of the notch.

In the 3D LED light-emitting plate, a thickness of the aluminum substrate is 1 mm.

The 3D LED light-emitting plate effectively improves the luminous brightness and efficiency of an LED and enlarges an effective light-emitting angle, and alleviates the problem of non-uniform light pattern and light color, such that an LED white light lamp can achieve the luminous effect of a tungsten lamp. The fluorescent colloid light-emitting shell correspondingly disposed outside the LED chip wraps the entire chip, which protects the chip from dust and produces white light. Moreover, since the colloid is completely out of contact with the chip, the chip is not subjected to any thermal expansion and contraction, and thus can work at a temperature of 105° C. to −35° C., and is suitable for use in a severe environment. The 3D LED light-emitting plate has a simple structure, thereby reducing the production cost.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
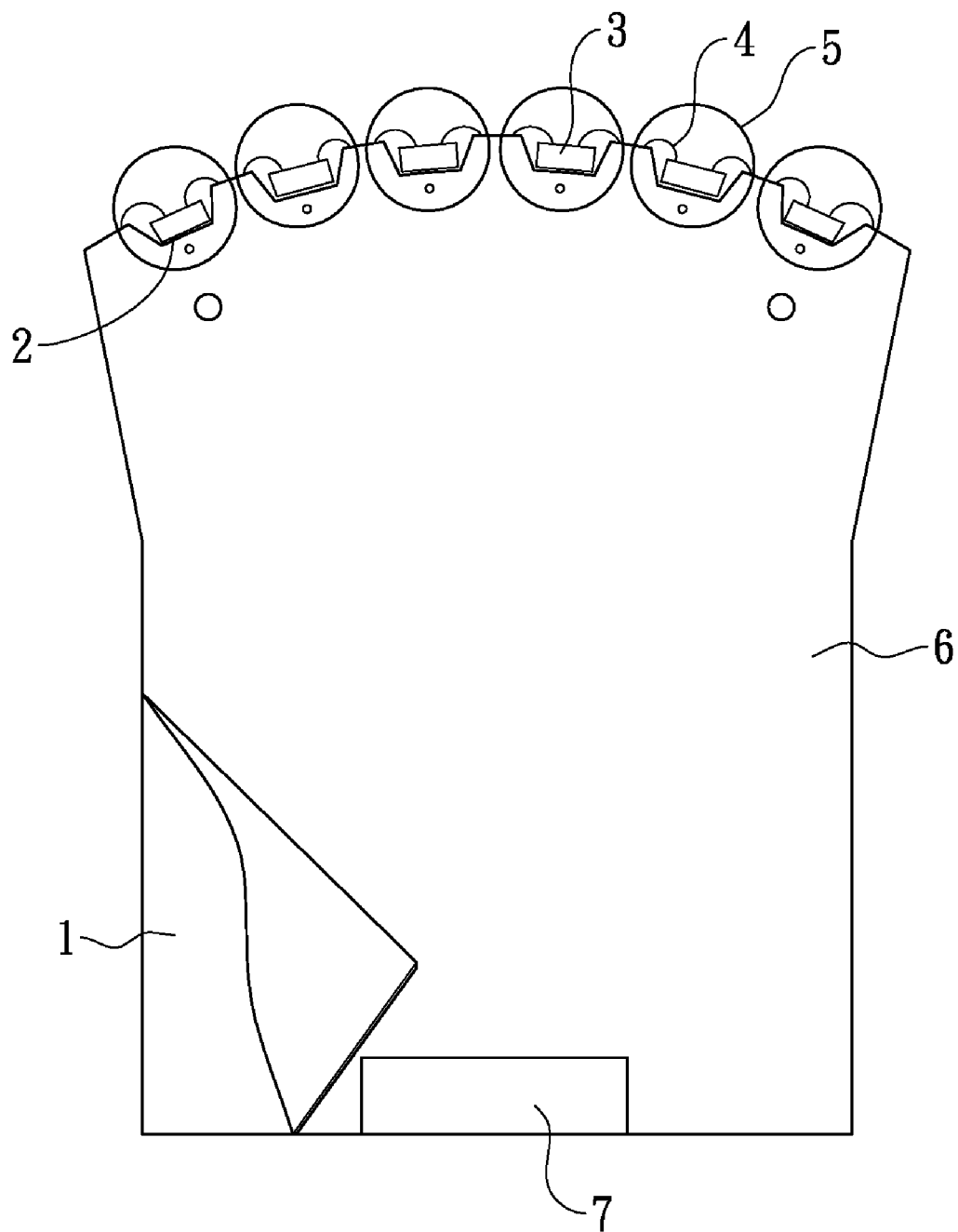
FIG. 1 is a schematic structural view of the present invention.
Figure 2:
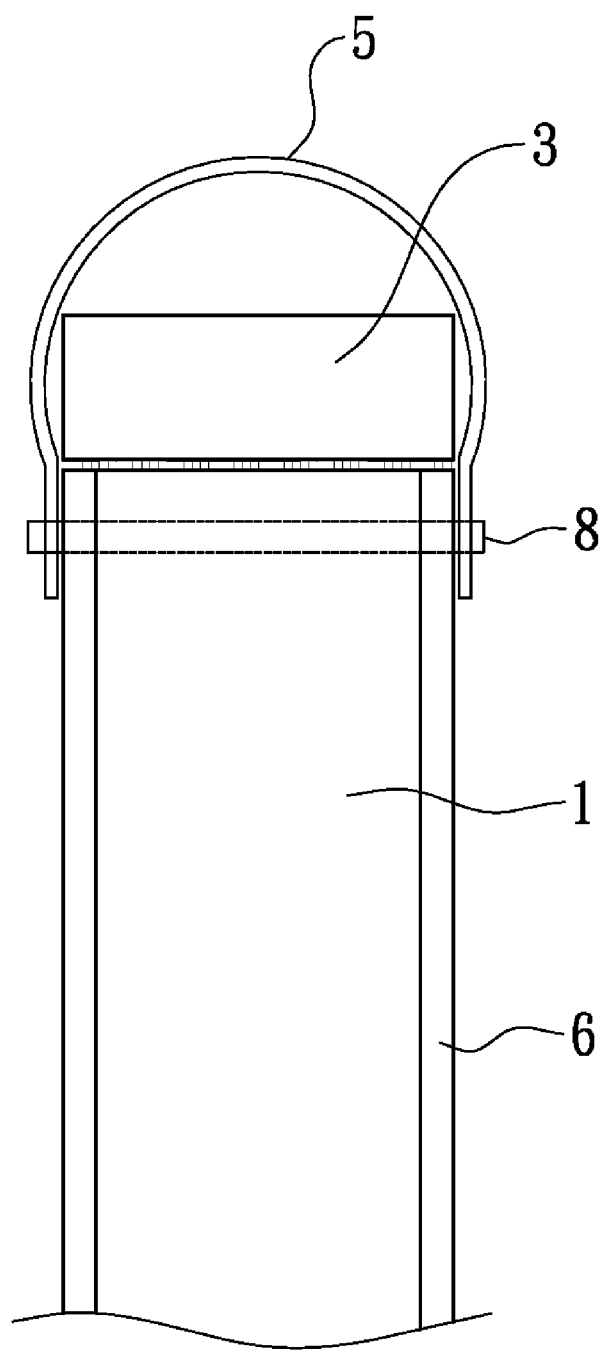
FIG. 2 is a schematic side view of the structure according to the present invention.

The present invention is further illustrated below with reference to the accompanying drawings.

As shown in the figures, an aluminum substrate 1 is vertically disposed. Notches 2 are formed on an upper side of the aluminum substrate 1 in a thickness direction. LED chips 3 are mounted in the notches 2, and each LED chip 3 is adhesively connected to a bottom of the notch 2. Front and rear sides of the LED chip 3 mounted in each notch 2 are in the same plane as front and back sides of the aluminum substrate 1. A connecting bayonet 7 is disposed at a bottom of the aluminum substrate 1, and is used for connecting the aluminum substrate 1 to other connectors. A shape of the aluminum substrate 1 may be designed as required. A flexible circuit layer 6 is disposed on a surface of the aluminum substrate 1, and each LED chip 3 is connected to a circuit of the flexible circuit layer 6 by a gold wire 4 so as to conduct the circuit. A fluorescent colloid light-emitting shell 5 is disposed outside each LED chip 3 correspondingly. A cavity is formed between the LED chip 3 and the fluorescent colloid light-emitting shell 5. A lower portion of the fluorescent colloid light-emitting shell 5 is fixed on the aluminum substrate 1. The fluorescent colloid light-emitting shell 5 usually employs a spherical structure having an opening disposed on a lower portion thereof, and a side of the fluorescent colloid light-emitting shell 5 having the opening is fitted on the aluminum substrate 1 and fixed by a pin 8. The fluorescent colloid light-emitting shell 5 wraps the entire chip, thereby protecting the chip from dust and producing white light. Moreover, since the LED chip 3 is completely out of contact with the fluorescent colloid light-emitting shell 5, the chip is not subjected to any thermal expansion and contraction, and thus can work at a temperature of 105° C. to −35° C., and is suitable for use in a severe environment.

Since the aluminum substrate 1 is an upright structure, the position of the LED chip 3 is elevated. Since the chip is fixed on the aluminum substrate 1, the heat dissipation effect is achieved. Sine two sides of the chip are completely exposed, a light-emitting function is achieved on the two sides of the chip, and a large-angle light-emitting area is achieved, such that the light emitted by the chip can be completely guided out. As such, the LED chip 3 at the high position illuminates downwards, and an effective light-emitting angle of 259 degrees is achieved, thereby improving the luminous performance of the LED chip 3 and alleviating the problem of non-uniform light pattern and light color. A power of the LED chip 3 is 1 w, and the luminous effect of a tungsten lamp can be achieved by connecting a plurality of LED chips 3 in series. The luminous brightness of the LED chip 3 is controlled by controlling a power supply thereof.

What is claimed is:

1. A three-dimensional (3D) light-emitting diode (LED) light-emitting plate, comprising an aluminum substrate (1), wherein the aluminum substrate (1) is vertically disposed, notches (2) are formed on an upper side of the aluminum substrate (1) in a thickness direction, LED chips (3) are mounted in the notches (2), a flexible circuit layer (6) is disposed on a surface of the aluminum substrate (1), each LED chip (3) is connected to a circuit of the flexible circuit layer (6) by a gold wire (4), a fluorescent colloid light-emitting shell (5) is disposed outside each LED chip (3) correspondingly, a cavity is formed between the LED chip (3) and the fluorescent colloid light-emitting shell (5), and a lower portion of the fluorescent colloid light-emitting shell (5) is fixed on the aluminum substrate (1).

2. The 3D LED light-emitting plate according to claim 1, wherein front and rear sides of the LED chip (3) mounted in each notch (2) are in the same plane as front and back sides of the aluminum substrate (1).

3. The 3D LED light-emitting plate according to claim 1, wherein a connecting bayonet (7) is disposed at a bottom of the aluminum substrate (1).

4. The 3D LED light-emitting plate according to claim 1, wherein the fluorescent colloid light-emitting shell (5) is a spherical structure having an opening disposed on a lower portion thereof, and a side of the fluorescent colloid light-emitting shell (5) having the opening is fitted on the aluminum substrate (1) and fixed by a pin (8).

5. The 3D LED light-emitting plate according to claim 1, wherein the LED chips (3) mounted in the notches (2) are connected in series, and a power of the LED chip (3) is 1 w.

6. The 3D LED light-emitting plate according to claim 1, wherein a light-emitting angle of the LED chip (3) mounted in each notch (2) is 259 degrees.

7. The 3D LED light-emitting plate according to claim 1, wherein the LED chip (3) is adhesively connected to a bottom of the notch (2).

8. The 3D LED light-emitting plate according to claim 1, wherein a thickness of the aluminum substrate (1) is 1 mm.

* * * * *